United States Patent

Semkow et al.

[11] Patent Number: 5,846,598
[45] Date of Patent: Dec. 8, 1998

[54] ELECTROLESS PLATING OF METALLIC FEATURES ON NONMETALLIC OR SEMICONDUCTOR LAYER WITHOUT EXTRANEOUS PLATING

[75] Inventors: Krystyna W. Semkow, Poughquag; Eugene J. O'Sullivan, Nyack, both of N.Y.

[73] Assignee: International Business Machines Corporation, Armonk, N.Y.

[21] Appl. No.: 815,337

[22] Filed: Mar. 11, 1997

Related U.S. Application Data

[63] Continuation of Ser. No. 565,602, Nov. 30, 1995, abandoned.

[51] Int. Cl.⁶ .................................................. B05D 5/12
[52] U.S. Cl. ..................... 427/98; 427/376.6; 427/437; 427/438
[58] Field of Search .................... 427/98, 376.6, 427/437, 438

[56] References Cited

U.S. PATENT DOCUMENTS

| | | | |
|---|---|---|---|
| 2,532,283 | 12/1950 | Brenner | 117/50 |
| 2,884,344 | 4/1959 | Ramirez | 117/130 |
| 2,994,369 | 8/1961 | Carlin | 159/47 |
| 3,672,940 | 6/1972 | Funada et al. | 117/47 A |
| 4,072,781 | 2/1978 | Shirahata et al. | 426/336 |
| 4,169,171 | 9/1979 | Narcus | 427/264 |
| 4,514,586 | 4/1985 | Waggoner | 174/35 MS |
| 4,600,609 | 7/1986 | Leever et al. | 427/438 |
| 4,770,899 | 9/1988 | Zeller | 427/96 |
| 4,997,686 | 3/1991 | Feldstein et al. | 427/443.1 |
| 5,026,616 | 6/1991 | Schumm, Jr. | 429/168 |
| 5,250,105 | 10/1993 | Gomes et al. | 106/1.11 |
| 5,269,838 | 12/1993 | Inoue et al. | 106/1.22 |
| 5,300,330 | 4/1994 | Feldstein et al. | 427/443.1 |
| 5,382,447 | 1/1995 | Kaja et al. | 427/126.6 |
| 5,403,650 | 4/1995 | Baudrand et al. | 428/209 |

OTHER PUBLICATIONS

F.A. Lowenheim, Ed., *Modern Electroplating*, Third Edition, Wiley–Interscience, New York (1974) pp. 710–731, 744, 745.
F. A. Lowenheim, *Electroplating*, McGraw–Hill, New York (1978) pp. 389–400.

*Primary Examiner*—Benjamin Utech
*Attorney, Agent, or Firm*—Dressler, Rockey, Milnamow & Katz

[57] ABSTRACT

In the manufacture of a microelectronic component having metallic features on a polyimide layer, the metallic features being spaced from one another by gaps, at least some of which gaps have widths in a range from about one micron to about 500 microns, corrosion protection is provided by plating those features by electroless deposition of a nickel-phosphorus alloy forming a layer having a thickness in a range from about 200 Å to about 3000 Å, at a rate of about 100 Å per minute, in an aqueous plating bath comprising nickel sulfate hexahydrate in an amount of about 5.5 grams per liter, sodium hypophosphite in an amount of about six grams per liter, boric acid in an amount of about 30 grams per liter, sodium citrate in an amount of about 45 grams per liter, lead acetate in an amount of about one part per million by weight of lead, and a surfactant in an amount of about 0.1 grams per liter. The bath has a temperature of about 72° C. and a pH of about 8.1. The gaps having widths of at least one micron remain essentially free of extraneous plating.

4 Claims, 1 Drawing Sheet

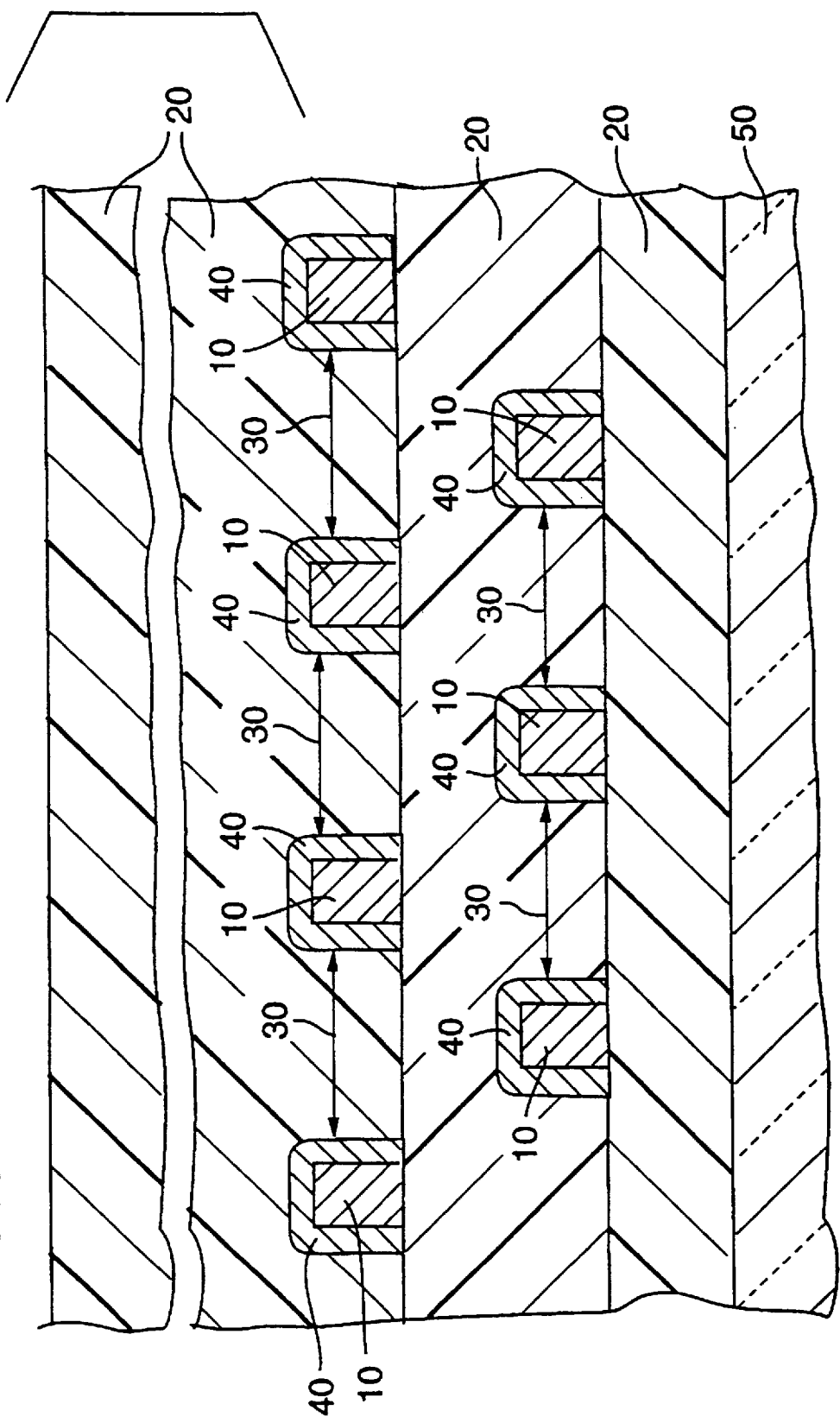

ELECTROLESS PLATING OF METALLIC FEATURES ON NONMETALLIC OR SEMICONDUCTOR LAYER WITHOUT EXTRANEOUS PLATING

This is a continuation of application Ser. No. 08/565,602, filed Nov. 30, 1995, now abandoned.

TECHNICAL FIELD OF THE INVENTION

This invention pertains generally to the manufacture of a microelectronic component, such as a high density system for interconnecting integrated circuits, and particularly to the provision of corrosion protection of thin copper, cobalt-capped copper, or other metallic features present on a nonmetallic layer, such as a polyimide, ceramic, or glass layer, or on a semiconductor layer by electroless plating of such metallic features with a nickel-phosphorus alloy. This invention avoids extraneous plating in gaps no wider than about one micron.

BACKGROUND OF THE INVENTION

In high density systems for interconnecting integrated circuits, thin (e.g. 0.2 micron to 12 micron) copper or other metallic features are sandwiched between nonmetallic layers, such as polyimide layers, which are cured in situ so as to form multilayer systems. As formed on the underlying layers, the metallic features are spaced by gaps, which may be no wider than about one micron. Since the metallic features tend to corrode excessively when exposed to precursor materials for the overlying layers, particularly at high curing temperatures, to chemical solutions, or to oxidizing atmospheres, it is necessary to provide corrosion protection of the metallic features.

Electroless nickel plating and electroless cobalt plating have been considered for providing corrosion protection on such metallic layers. See Kaja et al. U.S. Pat. No. 5,382,447. See, also, Zeller U.S. Pat. No. 4,770,899. See F. Pearlstein, "Electroless Plating," which is Chapter 31 of F. A. Lowenheim, Ed., *Modern Electroplating*, Third Edition, Wiley-Interscience, New York (1974) at pages 710–730, for a general exposition of electroless plating.

Usually, in electroless nickel plating as known heretofore, an aqueous plating bath containing a nickel salt, such as nickel sulfate or nickel chloride, a hypophosphite, such as sodium hypophosphite, and a salt of an organic acid, such as sodium citrate or sodium acetate, is employed. Acting as a reducing agent to convert nickel to its elemental form, the hypophosphite contributes phosphorus to the plated metal, which thus is a nickel-phosphorus alloy containing a major part of nickel and a minor part of phosphorus. The salt of an organic acid acts as a buffering agent and as a mild complexing agent for nickel. Accelerating agents, which are called exaltants, may be added to the aqueous plating bath. Stabilizers and brighteners also may be added.

Although nickel-phosphorus alloys are known to be highly corrosion resistant, electroless plating as known heretofore tends to deposit such alloys too rapidly, so as to cause extraneous plating in the gaps between such metallic features. Additional processing, such as ex situ ion beam scribing, may be then necessary to remove extraneous plating from the gaps between such metallic features, particularly if the gaps are narrower than about 500 microns, so as to avert short circuiting between the plated features. need has existed for an improved method for providing corrosion protection of metallic features on a nonmetallic layer, such as a polyimide, ceramic, or glass layer, or on a semiconductor layer, such as a silicon layer, without needing to employ such additional processing.

SUMMARY OF THE INVENTION

Addressing the need noted above, this invention provides an improved method of providing corrosion protection of metallic features present on a nonmetallic or semiconductor layer and spaced from one another by gaps, at least some of which have widths in a range from about one micron to about 500 microns. Broadly, the improved method contemplates electroless plating of such metallic features with a nickel-phosphorus alloy in a slow, controlled manner, in an aqueous plating bath comprising low concentrations of a nickel salt, a hypophosphite, buffering and complexing agents, a decelerating agent, and a surfactant, whereupon the gaps that have widths of at least one micron remain essentially free of extraneous plating. Thus, the improved method contemplates electroless plating of such metallic features with a nickel-phosphorus alloy forming a layer having a thickness in a range from about 300 Å to about 3000 Å, at a rate in a range from about 100 Å per minute to about 300 Å per minute. According to the improved method, the aqueous plating bath comprises a nickel salt in a range from about four grams per liter to about seven grams per liter, a hypophosphite in a range from about three grams per liter to about six grams per liter, a buffering agent in a range from about 10 grams per liter to about 40 grams per liter, a complexing agent in a range from about 30 grams per liter to about 60 grams per liter, a decelerating agent in a range from about 0.5 part per million to about 1.5 parts per million by weight, and a surfactant in a range from about 0.05 grams per liter to about 0.2 grams per liter. This invention contemplates that the bath has a temperature in a range from about 65° C. to about 80° C. and a pH in a range from about 7.5 to about 8.5.

In a preferred mode for carrying out this invention, the layer is a ceramic substrate with copper conductor lines on a polyimide layer. In the aqueous plating bath, the nickel salt is nickel sulphate hexahydrate in an amount of about 5.5 grams per liter, and the hypophosphite is sodium hypophosphite in an amount of about six grams per liter. The buffering agent is boric acid or sodium borate, boric acid being preferred, in an amount of about 30 grams per liter. The complexing agent is citric acid or sodium citrate, sodium citrate being preferred, in an amount of about 45 grams per liter. The decelerating agent is lead in a form of lead acetate or lead sulphite, preferably lead acetate, in an amount of about one part per million by weight of lead. The surfactant is used in an amount of about 0.1 grams per liter. The aqueous plating bath has a temperature of about 72° C. and a pH of about 8.1. A nickel-phosphorus alloy is deposited, which forms a layer having a thickness in a range from about 300 Å to about 3000 Å, at a rate of about 100 Å per minute. Extraneous plating is avoided in the gaps having widths of at least one micron.

These and other objects, features, and advantages of this invention are evident from the following description of a preferred mode for carrying out this invention with reference to the accompanying drawing.

BRIEF DESCRIPTION OF THE DRAWING

FIG. 1, which is not drawn to any scale or to true proportions, is a fragmentary, cross-sectional view of a high density system for interconnecting integrated circuits, the manufacture of which system employs the improved method provided by this invention.

DETAILED DESCRIPTION OF THE PREFERRED MODE

Being useful in the manufacture of a microelectronic component, such as a high density, planar system for interconnecting integrated circuits, and with reference to FIG. 1, this invention provides an improved method for providing corrosion protection of copper, cobalt-capped copper, or other metallic features 10 present on a nonmetallic layer 20, such as a polyimide layer, and spaced from one another by gaps 30, at least some of which have widths in a range from about one micron to about 500 microns. The metallic features 10 may be conductive lines or other features. Each of the metallic features 10 may comprise plural metallic layers. As shown in FIG. 1, plural polyimide layers 20 are provided on a ceramic substrate 50, the metallic features 10 being present on the lower layers 20.

Broadly, the improved method contemplates electroless plating of the metallic features 10 with a nickel-phosphorus [Ni(P)] alloy forming a layer 40 having a thickness in a range from about 300 Å to about 3000 Å, at a rate in a range from about 100 Å per minute to about 300 Å per minute, in an aqueous plating bath having a temperature in a range from about 65° C. to about 80° C. and a pH in a range from about 7.5 to about 8.5. The aqueous plating bath comprises low concentrations of a nickel salt, a hypophosphite, buffering and complexing agents, a decelerating agent, and a surfactant, namely the nickel salt in a range from about four grams per liter to about seven grams per liter, the hypophosphite in a range from about three grams per liter to about seven grams per liter, the buffering agent in a range from about 10 grams per liter to about 40 grams per liter, the complexing agent in a range from about 30 grams per liter to about 60 grams per liter, the decelerating agent in a range from about 0.5 part per million to about 1.5 parts per million by weight, and the surfactant in a range from about 0.05 grams per liter to about 0.2 grams per liter. This invention contemplates that the bath has a temperature in a range from about 65° C. to about 80° C. and a pH in a range from about 7.5 to about 8.5.

When the improved method is employed, the gaps 30 having widths of at least one micron remain essentially free of extraneous plating. It is unnecessary to employ additional processing, such as ex situ ion beam scribing, to remove extraneous plating from the gaps 30 having widths of at least one micron.

In the preferred mode for carrying out this invention, the layer 20 is a polyimide layer on a ceramic substrate 50. If the metallic features 10 are not catalytic for electroless nickel plating, the metallic features must be surface-activated, whereupon the polyimide layer 20 where exposed in the gaps 30 between the metallic features may need to be selectively deactivated. Suitable surface-activating and selective deactivating methods are disclosed in Kaja et al. U.S. Pat. No. 5,382,447, the disclosure of which is incorporated herein by reference. Other surface-activating and selective deactivating methods may be alternatively suitable.

In the aqueous plating bath used in the preferred mode for carrying out this invention, the nickel salt is nickel sulphate hexahydrate in an amount of about 5.5 grams per liter. Acting as a reducing agent to convert nickel to its elemental form, the hypophosphite is sodium hypophosphite in an amount of about six grams per liter. The buffering agent is boric acid in an amount of about 30 grams per liter. The complexing agent is sodium citrate in an amount of about 45 grams per liter. It is important to use buffering and complexing agent, such as boric acid and sodium citrate, which do not leave deleterious byproducts. A decelerating agent is used, which prevents plating from occurring too rapidly, and which thus helps to prevent extraneous plating in the gaps between the plated features. It has been found that lead acetate or lead sulphite is suitable as a decelerating agent, lead acetate being preferred in an amount of about one part per million by weight of lead. As the surfactant, Fluorad™ FC-98 surfactant (type: anionic; chemical description: potassium perfluoroalkyl sulfonates) which is available commercially from Minnesota Mining and Manufacturing Company, Industrial Chemical Products Division, St. Paul, Minn., in an amount of about 0.1 grams per liter is suitable. Other surfactants may be alternatively useful. The aqueous plating bath has a temperature of about 72° C. and a pH of about 8.1.

When the metallic features 20 present on the polyimide layer and spaced as noted above are subjected to electroless plating in the aqueous plating bath described in the preceding paragraph, the layer 40 of the nickel-phosphorus [Ni(P)] alloy is deposited on the metallic features so as to reach a thickness in a range from about 200 Å to about 3000 Å, at a rate of about 100 Å per minute. After the layer 40 reaches such a thickness, the polyimide layer 20 with the plated features 10 is removed from the aqueous plating bath and is rinsed. Although the layer 40 covers side walls of the plated features 10 so as to narrow the gaps 30 by about twice the thickness of the layer 40, the layer 40 does not cause extraneous plating or metallic bridging within the gaps 30 having widths of at least one micron. Nickel oxide forms superficially on the plated layer 40 and contributes to corrosion protection. Phosphorus in the plated layer 40 also contributes to corrosion protection.

In a first example, a nickel-phosphorus [Ni(P)] layer having a thickness in a range from about 500 Å to about 1000 Å was plated by the preferred mode described above on metallic features present on a polyimide layer and comprised of a chromium layer contacting the polyimide layer and having a thickness of about 200 Å, a copper layer covering the chromium layer and having a thickness of about 4.5 microns, and a layer of a cobalt-phosphorus [Co(P)] alloy covering the copper layer and having a thickness in a range of about 1000 Å to about 2500 Å, such features being spaced by gaps having widths of about ten microns. The nickel-phosphorus layer was plated on the layer of the cobalt-phosphorus alloy. No additional processing, such as ex situ ion beam scribing, was employed to remove extraneous plating from the gaps. No extraneous plating was observed in the gaps. After five simulated polyimide curing cycles, no preferential diffusion of nickel into copper was observed, and the resistivity of the copper layer remained within experimental error.

In a second example, a nickel-phosphorus [Ni(P)] layer having a thickness in a range from about 1000 Å to about 1500 Å was plated by the preferred mode described above on two sets of metallic features. In a first set, each metallic feature was comprised of two layers, namely a chromium layer contacting a glass layer and having a thickness of about 300 Å and a copper layer covering the chromium layer and having a thickness of about 3000 Å, and the nickel-phosphorus layer was plated on the copper layer. In a second set, each metallic feature was comprised of three layers, namely similar chromium and copper layers and a chromium layer covering the copper layer and having a thickness of about 1200 Å, the nickel-phosphorus layer was plated on the side walls of the copper layer. The plating step was followed by a heating step in a forming gas atmosphere at a temperature of about 450° C. to about 550° C. During exposure to air at about 450° C., the plated features showed good corrosion resistance. Where exposed, the copper layer corroded extensively and produced oxides, which caused bridging.

Although the preferred mode described above provides corrosion protection of copper, cobalt, or other metallic features present on a polyimide layer and spaced from one another by gaps, at least some of which have widths in the range specified above, the improved method provided by this invention is expected to be similarly useful for providing corrosion protection of such metallic features present and spaced similarly on another nonmetallic layer, such as another polymeric layer or a ceramic layer, or on a semiconductor layer, such as a silicon layer.

Although a preferred mode for carrying out this invention in the manufacture of a planar system for interconnecting integrated circuits has been described, this invention is useful also in the manufacture of other microelectronic components, which include but are not limited to non-planar systems for interconnecting integrated circuits.

Various modifications may be made in the preferred mode described above without departing from the scope and spirit of this invention.

We claim:

1. In the manufacture of a microelectronic component having metallic features on a nonmetallic or semiconductor layer, the metallic features being spaced from one another by gaps, at least some of which gaps have widths in a range from about one micron to about 500 microns, a method of providing a coating on the metallic features, the method comprising the step of electroless plating of the metallic features with a nickel-phosphorus alloy and forming a layer having a thickness in a range from about 300 Å to about 3000 Å, at a rate in a range from about 100 Å per minute to about 300 Å per minute, in an aqueous plating bath consisting essentially of water, a nickel salt in a range from about four grams per liter to about seven grams per liter, a hypophosphite in a range from about three grams per liter to about six grams per liter, a buffering agent in a range from about 30 grams per liter to about 40 grams per liter, a complexing agent in a range from about 30 grams per liter to about 60 grams per liter, a decelerating agent in a range from about 0.5 part per million to about 1.5 parts per million by weight, and a surfactant in a range from about 0.05 grams per liter to about 0.2 grams per liter, the bath having a temperature in a range from about 65° C. to about 80° C. and a pH in a range from about 7.5 to about 8.5, whereby the gaps having widths of at least one micron remain free of extraneous plating.

2. The method of claim 1 wherein the layer is a polyimide layer, the nickel salt is nickel sulfate hexahydrate, the hypophosphite is sodium hypophosphite, the buffering agent is boric acid or sodium borate, the complexing agent is citric acid or sodium citrate, and the decelerating agent is lead acetate or lead sulphite.

3. The method of claim 2 wherein the buffering agent is boric acid, the complexing agent is sodium citrate, and the decelerating agent is lead acetate.

4. In the manufacture of a microelectronic component having metallic features on a polyimide layer, the metallic features being spaced from one another by gaps, at least some of which gaps have widths in a range from about one micron to about 500 microns, a method of providing a coating on the metallic features, the method comprising the step of electroless plating of the metallic features with a nickel-phosphorous alloy and forming a layer having a thickness in a range from about 200 Å to about 3000 Å, at a rate of about 100 Å per minute, in an aqueous plating bath consisting essentially of water, nickel sulfate hexahydrate in an amount of about 5.5 grams per liter, boric acid in an amount of about 30 grams per liter, sodium hypophosphite in an amount of about six grams per liter, sodium citrate in an amount of about 45 grams per liter, lead acetate in an amount of about one part per million by weight of lead, and a surfactant in an amount of about 0.1 grams per liter, the bath having a temperature of about 72° C. and a pH of about 8.1, whereby the gaps having widths of at least one micron remain free of extraneous plating.

* * * * *